(12) United States Patent
Nishikawa

(10) Patent No.: US 10,177,210 B2
(45) Date of Patent: Jan. 8, 2019

(54) DISPLAY DEVICE HAVING REDUNDANT WIRINGS

(71) Applicant: Japan Display Inc., Tokyo (JP)

(72) Inventor: Hiromi Nishikawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/728,985

(22) Filed: Oct. 10, 2017

(65) Prior Publication Data

US 2018/0108722 A1    Apr. 19, 2018

(30) Foreign Application Priority Data

Oct. 14, 2016    (JP) ................. 2016-202428

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2251/5338* (2013.01)

(58) Field of Classification Search
CPC .................................................. H01L 27/3276
See application file for complete search history.

(56) References Cited

U.S. PATENT DOCUMENTS

| 9,276,055 B1* | 3/2016 | Son ................. H01L 27/3276 |
| 2001/0055085 A1* | 12/2001 | Jinno ................. G02F 1/1345 |
| | | 349/139 |
| 2004/0012744 A1 | 1/2004 | Ishige et al. |
| 2012/0293496 A1* | 11/2012 | Park ................. G09G 3/003 |
| | | 345/419 |
| 2015/0084025 A1* | 3/2015 | Horiguchi ........... H01L 51/5253 |
| | | 257/40 |

FOREIGN PATENT DOCUMENTS

| JP | H09-311341 A | 12/1997 |
| JP | 2004-053702 A | 2/2004 |

* cited by examiner

*Primary Examiner* — Lex Malsawma
*Assistant Examiner* — Xia Cross
(74) *Attorney, Agent, or Firm* — Typha IP LLC

(57) ABSTRACT

A display device includes a substrate having an edge portion, a display region located on the substrate and separated from the edge portion, a drive circuit region between the display region and the edge portion, a terminal region on the edge portion; and wirings in the display region, the drive circuit region, and an area between the drive circuit region and the terminal region, wherein at least one wiring of the wirings include a first conductive layer, a second conductive layer overlapping the first conductive layer in a plan view and separated from the first conductive layer, a first connection portion where the first conductive layer and the second conductive layer are electrically connected, a second connection portion where the first conductive layer and the second conductive layer are electrically connected, and the first connection portion is separated from the second connection portion.

4 Claims, 18 Drawing Sheets

DISPLAY DEVICE HAVING REDUNDANT WIRINGS

CROSS-REFERENCE TO RELATED APPLICATIONS

This application is based upon and claims the benefit of priority from the prior Japanese Patent Application No. 2016-202428, filed on Oct. 14, 2016, the entire contents of which are incorporated herein by reference.

FIELD

One embodiments of the present invention relate to a wiring structure of a display device.

BACKGROUND

Display devices such as liquid crystal display devices and organic electroluminescence display devices (hereinafter referred to as "organic EL display devices") have a display region in which a pixel is arranged, a drive circuit region in which a drive circuit outputting signals to the display region is arranged, and a terminal region in which a terminal electrode is arranged. The drive circuit region and the terminal region are arranged in the periphery of the display region, thus they may be combined and referred to as a peripheral region. In order to reduce a size of a display device, the surface area held by the peripheral region must be as small as possible while maintaining the surface area (screen size) of the display region. For example, a display device is disclosed in which wirings provided in the peripheral region are multilayered in order to narrow the width of the peripheral region (for example, see Japanese Laid-Open Patent Publication No. Hei 09-311341, Japanese Laid-Open Patent Publication No. 2004-053702).

As one type of a display device, a display device which may be folded and bent is being developed. A display device having flexibility such as this is called a flexible display or a sheet display. However, it is problem that the wiring is disconnected by bending and causing display defects in a display device having flexibility.

SUMMARY

A display device in an embodiment according to the present invention includes a substrate having an edge portion, a display region located on the substrate and separated from the edge portion, a drive circuit region between the display region and the edge portion, a terminal region on the edge portion; and a plurality of wirings in the display region, the drive circuit region, and an area between the drive circuit region and the terminal region, wherein at least one wiring of the plurality of wirings include a first conductive layer, a second conductive layer overlapping the first conductive layer in a plan view and separated from the first conductive layer, a first connection portion at which the first conductive layer and the second conductive layer are electrically connected, a second connection portion at which the first conductive layer and the second conductive layer are electrically connected, and the first connection portion is separated from the second connection portion.

A display device in an embodiment according to the present invention includes a substrate and a display region including a plurality of pixels on a plane of the substrate, wherein the display region includes a second insulating layer above the substrate, a first wiring above the second insulating layer running in a first direction, a third insulating layer above the second insulating layer, a second wiring running in a second direction intersecting the first wiring, the second wiring includes a first conductive layer above the second insulating layer; and a second conductive layer above the third insulating layer, the first conductive layer and the second conductive layer are electrically connected at a first connection portion and a second connection portion separated from the first connection portion, the first connection portion is in a first contact hole penetrating the third insulating layer, and the second connection portion is in a second contact hole penetrating the third insulating layer.

A display device in an embodiment according to the present invention includes a substrate and a display region including a plurality of pixels on a plane of the substrate, wherein the display region includes a second insulating layer above the substrate, a first wiring above the second insulating layer running in a first direction, a third insulating film above the second insulating layer, a second wiring running in a second direction intersecting the first wiring, the first wiring includes a first conductive layer below the second insulating layer; and a second conductive layer above the second insulating layer, the first conductive layer and the second conductive layer are electrically connected at a first connection portion and a second connection portion separated from the first connection portion, the first connection portion is in a first contact hole penetrating the second insulating layer, and the second connection portion is in a second contact hole penetrating the second insulating layer.

DESCRIPTION OF EMBODIMENTS

Hereinafter, embodiments of the present invention will be described while referencing the drawings and the like. However, the present invention may be implemented in many different ways, and interpretation is not limited to the content exemplified below. In order to provide a clearer description, some components of the drawings such as the width, thickness, and shape of each part are represented schematically. These drawings are merely examples and do not limit interpretation of the present invention. In this specification and in each of the drawings, elements similar to previously described elements are marked with the same symbols and detailed descriptions are omitted accordingly.

In this specification, when certain components or regions are described as being "above" or "below" other components or regions, as long as there are no limitations, it does not necessarily mean they are directly above or below. This description includes cases in which a component or region is located higher or lower than another component or region. That is to say, other structural elements are located between the component or region being described and the component or region above or below.

In this specification, so long as there are no limitations, when "above" is used it indicates a direction moving away from the plane of the substrate, with the substrate as a reference point. For example, when a first layer is arranged on a plane of a substrate and a second layer is arranged above the first layer, this means that the second layer is arranged at a position relatively separated from the substrate.

First Embodiment 1-1. Structure of Display Device

Figure 1:
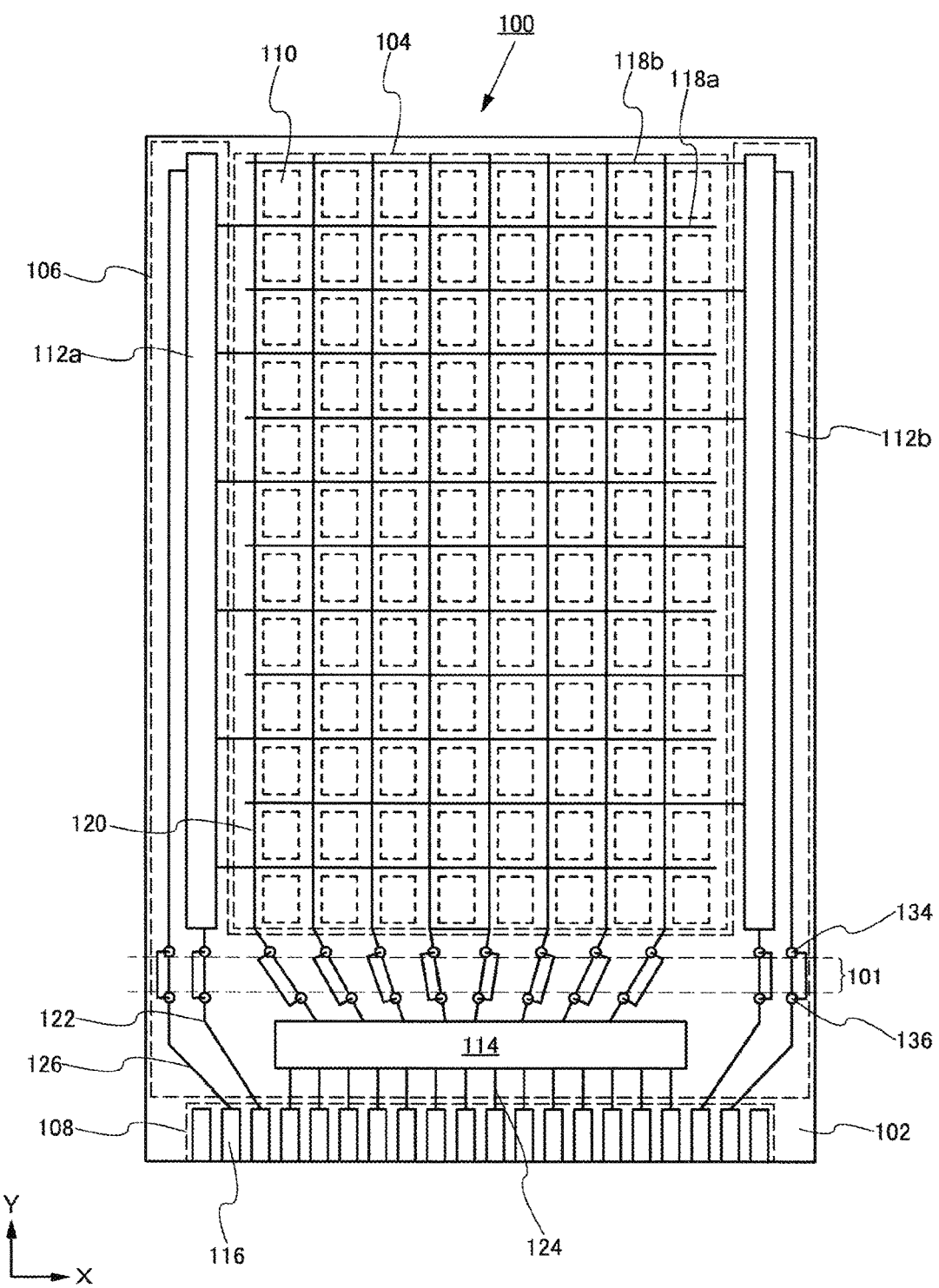
FIG. 1 is a diagram showing the structure of a display device according to an embodiment of the present invention.

FIG. 1 shows the structure of a display device 100 according to an embodiment of the present invention. In the display device 100, a display region 104, a drive circuit region 106, and a terminal region 108 are arranged on a plane of a substrate 102. A plurality of pixels 110 are arranged, and first wirings 118a, 118b, and a second wiring 120 are provided in the display region 104. First drive circuits 112a, 112b, and a second drive circuit 114 are arranged in the drive circuit region 106. A plurality of terminal electrodes 116 are arranged in the terminal region 108.

The plurality of pixels 110 are arranged in an X direction and a Y direction in the display region as shown in FIG. 1. The first wirings 118a, 118b are arranged in the X direction, and the second wiring 120 is arranged in the Y direction. The first drive circuit 112a outputs scanning signals to the first wiring 118a, and the first drive circuit 112b outputs scanning signals to the first wiring 118b. A second drive circuit 114 outputs video signals to the second wiring 120. The display device 100 includes a third wiring 122 a fourth wiring 124, and a fifth wiring 126 that are arranged between the drive circuit region 106 and the terminal region 108.

In the present embodiment, the substrate 102 has flexibility, and it is possible to bend the display device 100. For example, the display device 100 includes a bending region 101 along one side of the substrate 102 as is shown in FIG. 1. It is possible to bend the display device 100 at a predetermined curvature or a predetermined angle in the bending region 101. In FIG. 1, the bending region 101 is arranged in the region between the display region 104 and the drive circuit region 106 (specifically the second drive circuit 114b). When the substrate 102 is bent in the bending region 101, the second wiring 120, the third wiring 122, and the fifth wiring 126 may also be bent.

The second wiring 120 has a stacked structure including a first conductive layer and a second conductive layer in the bending region 101. The first conductive layer and the second conductive layer are provided sandwiching an insulating layer. The first conductive layer is provided on the substrate 102 side (that is to say, below) with respect to the second conductive layer, and the second conductive layer is provided above the first conductive layer. The first conductive layer and the second conductive layer are electrically connected by a first connection portion 134 and a second connection portion 136 provided on the outer sides of the bending region 101. A wiring structure such as this the same for the third wiring 122 and the fifth wiring 126 intersecting the bending region 101.

In this way, the display device 100 includes the bending region 101 in which the substrate 102 may be bent, and the wiring is multilayered in the region intersecting the bending region 101 and in the adjacent region. Wiring disconnection is prevented by a multilayered wiring. Further, the wiring intersecting the bending region 101 is not limited to two layers of a first conductive later and a second conductive layer, and three or more conductive layers may be stacked.

1-2. Structure of Wiring

Figure 2A:
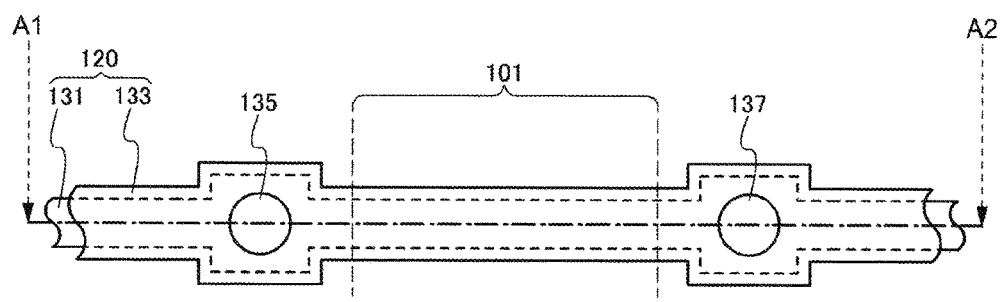
FIG. 2A is a plan view showing the structure of a wiring according to an embodiment of the present invention.
Figure 2B:
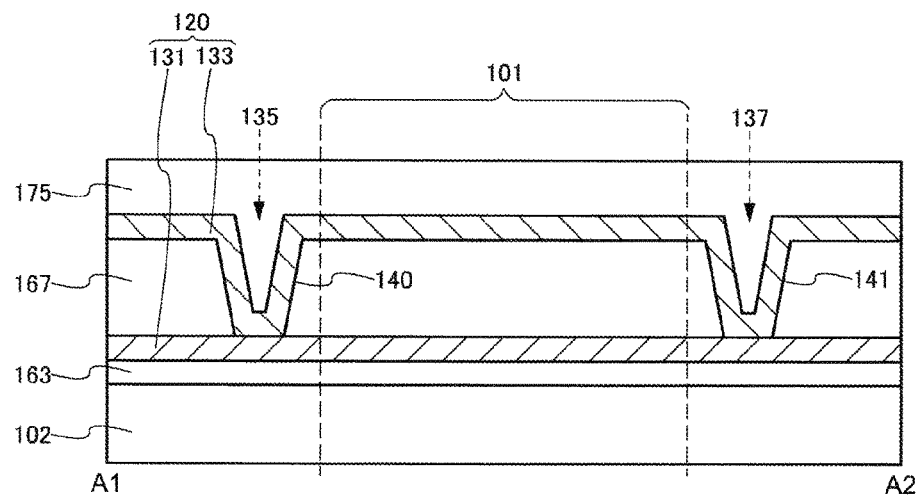
FIG. 2B is a diagram showing the structure of a wiring according to an embodiment of the present invention, and shows a cross-section corresponding to line A1-A2 shown in FIG. 2A.

The structure of the second wiring 120 arranged intersecting the bending region 101 of the display device 100 will be described referencing FIG. 2A and FIG. 2B. FIG. 2A shows a plan view of the second wiring 120 in the bending region 101, and FIG. 2B shows the cross-sectional structure corresponding to line A1-A2.

As is shown in FIG. 2A, the second wiring 120 is arranged so as to intersect the bending region 101, and is configured by a first conductive layer 131 and a second conductive layer 133. The first conductive layer 131 and the second conductive layer 133 are arranged overlapping in a plan view. As is shown in FIG. 2B, the first conductive layer 131 is arranged below and the second conductive layer 133 is arranged above so as to sandwich an interlayer insulating layer 167. By arranging the first conductive layer 131 and the second conductive layer 133 overlapping in a planar view, it is possible to realize multiple layers without changing the adjacent spaces of the second wiring 120.

The substrate 102 has flexibility and may be bent and folded in the bending region 101. A resin material such as a polyimide may be applied as material of the substrate 102. A base insulating layer 163 is provided between the substrate 102 and the first conductive layer 131, and a passivation layer 175 may be provided above the second conductive layer 133.

The first conductive layer 131 and the second conductive layer 133 are electrically connected by a first connection portion 135 and a second connection portion 137. The first connection portion 135 and the second connection portion 137 are arranged on the outer sides of the bending region 101. The first connection portion 135 and the second connection portion 137 include a first contact hole 140 and a second contact hole 141 formed in the interlayer insulating layer 167, respectively. In the first connection portion 135 and the second connection portion 137, the wiring in one of or both the first conductive layer 131 and the second conductive layer 133 may be formed having a greater width than that of other regions. Thus, the first conductive layer 131 and the second conductive layer 133 may have a reliable electrical connection. The first conductive layer 131 and the second conductive layer 133 have the same potential by being electrically connected by the first connection portion 135 and the second connection portion 137, thus parasitic capacitance is not generated. Therefore, even if the second wiring 120 has multiple layers, signal delay due to parasitic capacitance may be prevented. In other words, the same signal is applied to the first conductive layer 131 and the second conductive layer 133, thus preventing non-transmission of signals due to wiring disconnection.

The number of contact holes formed in the connection region is arbitrary, and a plurality of contact holes may be included in one connection region. That is, a plurality of contact holes may be provided in the first connection portion 135 and the second connection portion 137. For example, the plurality of contact holes may be provided along the length (longitudinal direction) of the second wiring 120. By a structure such as this, even when the first conductive layer 131 and the second conductive layer 133 do not conduct in a certain contact hole in the first connection portion 135 and second connection portion 137, disconnection of the second wiring 120 may be prevented by maintaining conduction in another contact hole in the first connection portion 135 and second connection portion 137. In any case, even when the substrate 102 is bent, it is possible to prevent the bending stress acting on the connection portions by arranging the first connection portion 135 and the second connection portion 137 on the outer sides of the bending region 101. In this way, a state in which the first conductive layer 131 and the second conductive layer 133 are electrically connected may be maintained in the first connection portion 135 and the second connection portion 137.

The first conductive layer 131 and the second conductive layer 133 are structured so as not to directly come in contact in regions other than the first connection portion 135 and the second connection portion 137. By providing the first conductive layer 131 and the second conductive layer 133 so that both conductive layers are electrically connected, when the substrate 102 is bent or folded, even if one of the conductive layers is disconnected, conductivity is maintained by another conductive layer, and disconnection problems in the second wiring 120 may be prevented.

For example, when folding the substrate 102 so-that the surface on which the first conductive layer 131 and the second conductive layer 133 are provided is convex, the curvature radius of the first conductive layer 131 provided on the side close to the substrate 102 is smaller than that of the second conductive layer 133. In other words, when the substrate 102 is bent, the curvature radius of the first conductive layer 131 and the second conductive layer 133 may be different by providing the interlayer insulating layer 167 between the first conductive layer 131 and the second conductive layer 133. In this way, the amount of bending stress acted on the first conductive layer 131 and the second conductive layer 133 may be different, therefore even if one of the conductive layers breaks, it is possible to prevent the other conductive layer from breaking.

The first conductive layer 131 and the second conductive layer 133 are formed by a conductive thin film. A metallic film such as aluminum, titanium, tantalum, tungsten, or copper, a metallic nitride film such as titanium nitride, or a metallic oxide film such as indium oxide or zinc oxide may be applied as a conductive thin film. The first conductive layer 131 and the second conductive layer 133 may be formed by the same type of conductive material, or each conductive layer may be formed of different conductive materials.

For example, when the first conductive layer 131 is formed of molybdenum or a molybdenum alloy, and the second conductive layer 133 is formed of aluminum or an aluminum alloy with better plasticity than the first conductive layer 131, even if the first conductive layer 131 breaks by bending the substrate 102, the second conductive layer 133 is plastically deformed and does not break, thus conduction of the second wiring 120 is maintained.

The base insulating layer 163 may be formed of an inorganic insulating film such as a silicon oxide film or a silicon nitride film, and the interlayer insulating layer 167 and the passivation layer 175 may be formed of an organic insulating film such as a polyimide resin, an acrylic resin, or an epoxy resin, in addition to the inorganic insulating film previously described.

As is shown in FIG. 2A and FIG. 2B, two connection portions are provided for the first conductive layer 131 and the second conductive layer 133, however, the embodiments of the present invention are not limited to this, and only one of the first connection portion 135 and second connection portion 137 may be provided. Additionally, the connection portion of the first conductive layer 131 and the second conductive layer 133 is not limited to the region adjacent to the bending region 101, and may be provided in various places other than the bending region 101. Further, the second wiring 120 is exemplified in FIG. 2A and FIG. 2B, however, another wiring intersecting the bending region 101 may be similarly applied.

Figure 3:
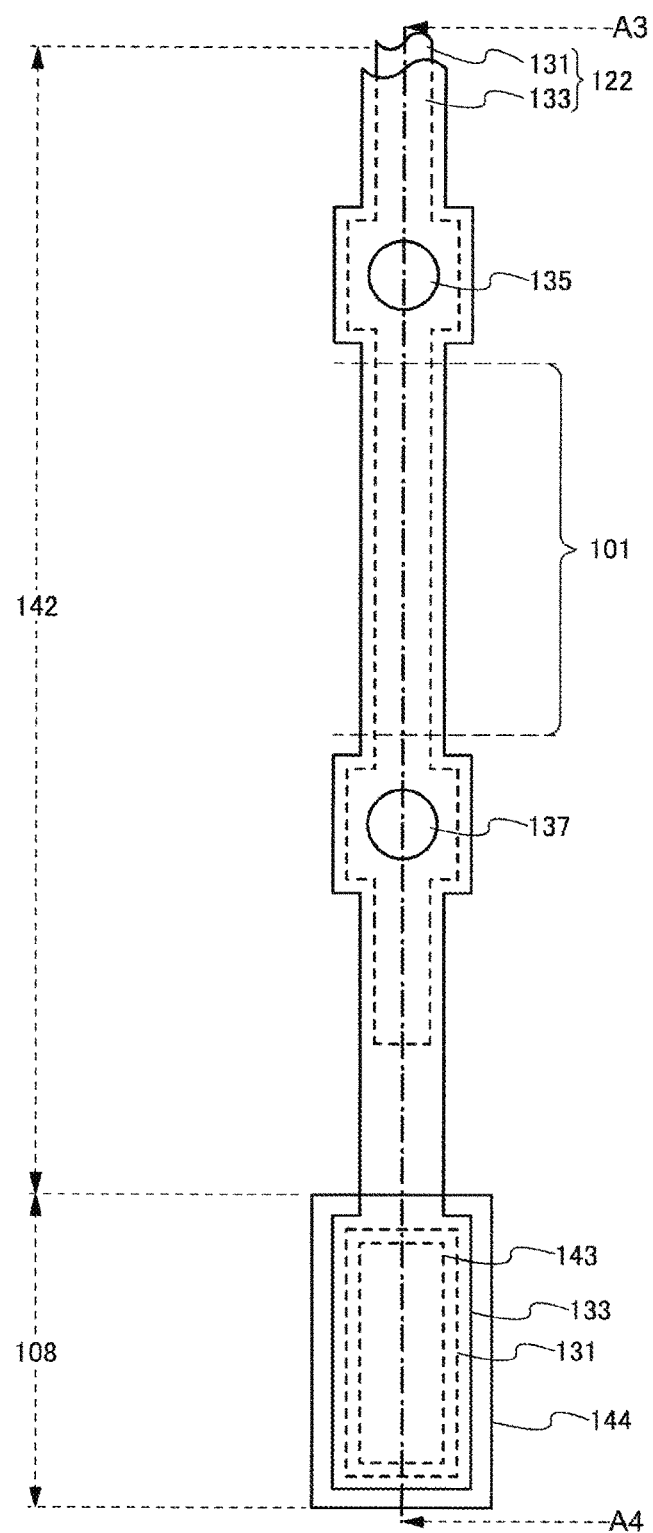
FIG. 3 is a plan view showing the structure of a wiring and a terminal electrode according to an embodiment of the present invention.
Figure 4:
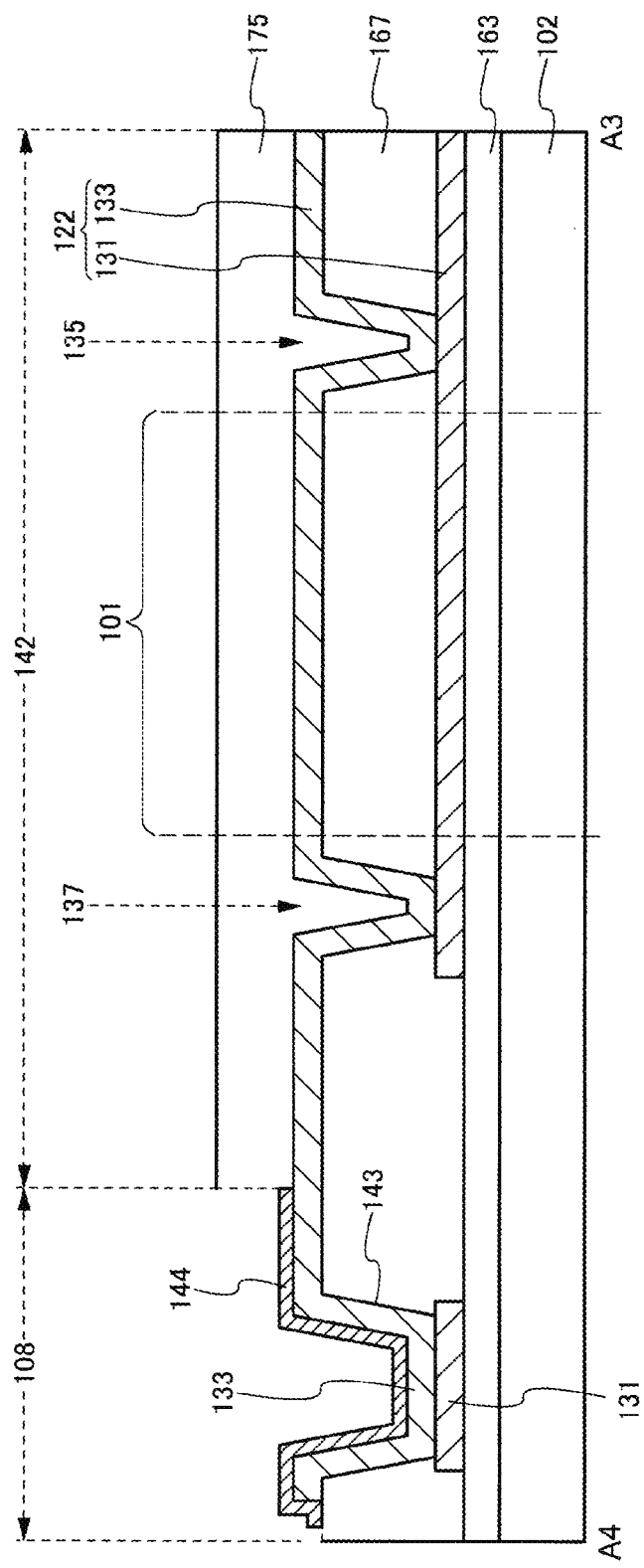
FIG. 4 is a diagram showing the structure of a wiring and a terminal electrode according to an embodiment of the present invention, and shows a cross-sectional structure corresponding to line A3-A4 shown in FIG. 3.

FIG. 3 and FIG. 4 show an example of the third wiring 122 connected to the terminal electrode 116. FIG. 3 shows a plan view of the third wiring 122, and a cross-sectional structure corresponding to line A3-A4 is shown in FIG. 4. FIG. 3 and FIG. 4 show a wiring region 142 in which the third wiring 122 is provided, and the terminal region 108 in which the terminal electrode 116 is provided.

As is shown in FIG. 4, the base insulating layer 163, the interlayer insulating layer 167, and the passivation layer 175 are provided in the wiring region 142. These insulating layers are the same as those shown in FIG. 2B. The second conductive layer 133 continues from the wiring region 142 to the terminal region 108. An opening 143 is provided in the interlayer insulating layer 167, and the terminal region 108 has a structure in which the first conductive layer 131 and the second conductive layer 133 are stacked. In the terminal region 108, the passivation layer 175 is removed, and a conductive layer 144 is provided above the second conductive layer 133. The conductive layer 144 is preferably formed of a conductive metallic oxide such as indium tin oxide (it is called ITO). By providing the conductive layer 144, the surface of the second conductive layer 133 formed of metal such as aluminum is protected. The terminal electrode 116 has a structure in which the first conductive layer 131, the second conductive layer 133, and the conductive layer 144 are stacked.

The first conductive layer 131 is provided close to the base insulating layer 163. The first conductive layer 131 and the second conductive layer 133 are stacked, thus adhesion of the terminal electrode 116 to the substrate 102 is increased. Additionally, the film thickness of the terminal electrode 116 may be achieved by stacking the first conductive layer 131 and the second conductive layer 133. Therefore, the terminal electrode 116 may have a solid structure.

FIG. 3 and FIG. 4 show an embodiment in which the second conductive layer 133 may extend to the terminal region 108 in the wiring region 142. However, the embodiments of the present invention are not limited to this, and the first conductive layer 131 may extend from the wiring region 142 to the terminal region 108. In any case, by stacking the first conductive layer 131 and the second conductive layer 133 in the terminal region 108, the terminal electrode 116 may have a solid structure. FIG. 3 shows an example of the third wiring 122, and a similar structure may be applied to the fifth wiring 126 intersecting the bending region 101.

1-3. Bending Region and Wiring of Display Device

Figure 5:
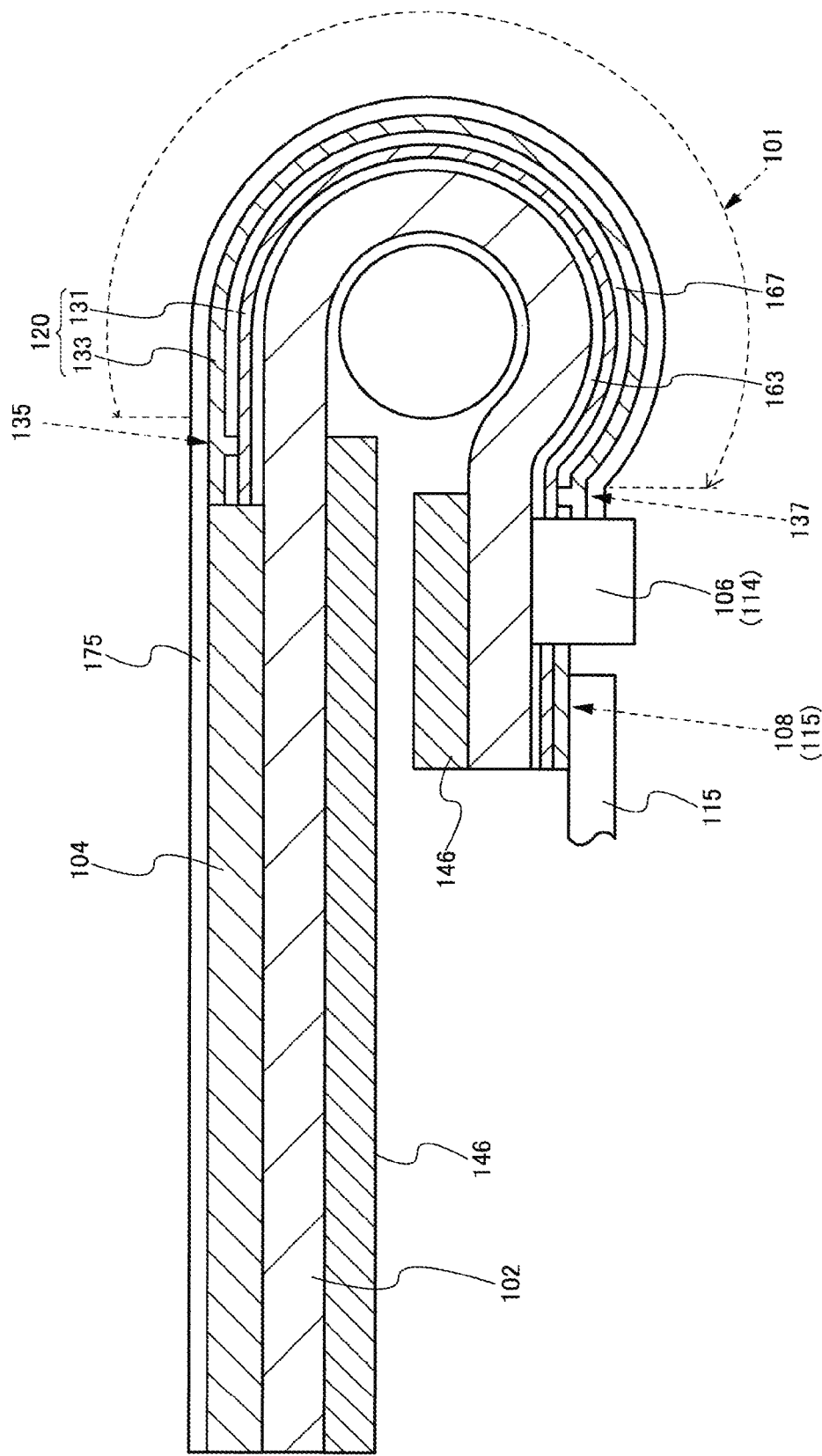
FIG. 5 is a cross-sectional view showing a state in which a substrate is bent in a bending region of a display device according to an embodiment of the present invention.

FIG. 5 is a cross-sectional view showing a state in which the substrate 102 is bent in the bending region 101 of the display device 100. In the display device 100, the substrate 102 is bent so that the second drive circuit 114 included in the drive circuit region 106 is arranged on the back side of the display region 104. The second wiring 120 is bent with the substrate 102 in the bending region 101. The second wiring 120 is configured by the first conductive layer 131 and the second conductive layer 133, and the interlayer insulating layer 167 is provided between the first conductive layer 131 and the second conductive layer 133. The first connection portion 135 and the second connection portion 137 are provided in the region on the outer sides of the bending region 101. The first conductive layer 131 and the second conductive layer 133 are electrically connected by the first connection portion 135 and the second connection portion 137, respectively.

In FIG. 5, a support member 146 is provided on the rear surface side (the surface facing the plane surface) of the substrate 102 in the region overlapping the display region 104, the drive circuit region 106, and the terminal region 108. The support member 146 substantially thickens the substrate 102 so it cannot be bent. The support member 146 has a notch in the bending region 101. Since the notch of the support member 146 is provided in the bending region 101, it is possible to preferentially bent the substrate 102 in the bending region 101. On the other hand, since the support member 146 is provided on the substrate 102, the flexible print wiring substrate 115 adhered to the terminal electrode 116 may be stably held in place.

Bending stress acts on the bending region 101 in the second wiring 120. When the substrate 102 is bent, the first conductive layer 131 and the second conductive layer 133 are bent at different curvature radiuses. The second conductive layer 132 is provided in a position relatively separated from the substrate 102 with regard to the first conductive layer 130. When bending stress is acted, the wiring of one of the first conductive layer 130 and the second conductive layer 132 is arranged close to a neutral plane (imaginary plane which does not extend or shrink due to bending stress), so even if bending stress acts strongly on one conductive layer, disconnection of the other conductive layer may be prevented. In this way, a two-layer wiring is provided in the bending region 101, and the first conductive layer 131 and the second conductive layer 133 are electrically connected in the outer regions of the bending region 101, thus providing redundancy against breakage in the second wiring 120. Therefore, defects of the display device 100 due to wiring disconnection may be prevented.

1-4. Equivalent Circuit of Pixel

Figure 6:
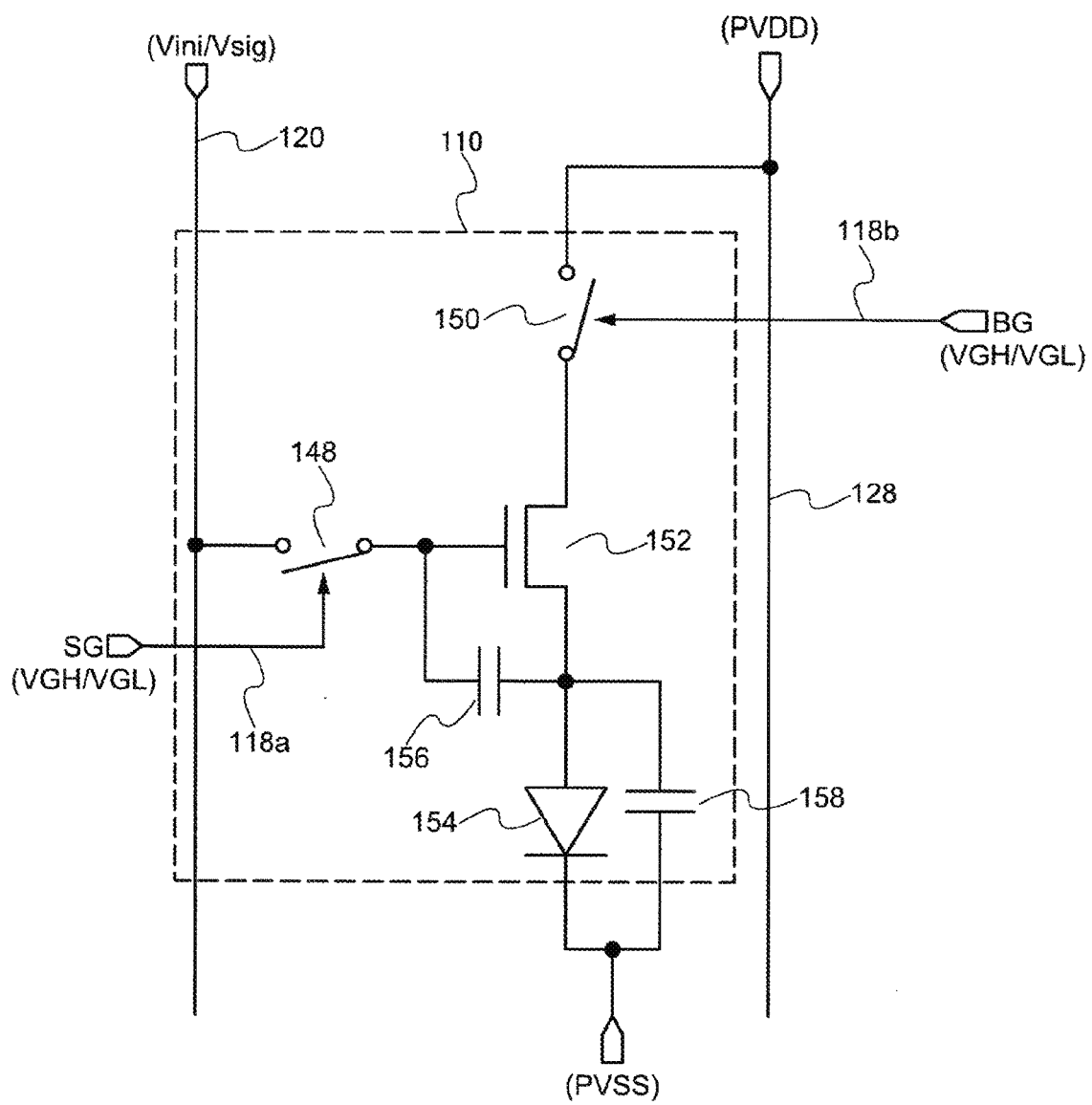
FIG. 6 shows an equivalent circuit of a pixel in a display device according to an embodiment of the present invention.

FIG. 6 shows an example of an equivalent circuit of the pixel 110. The pixel 110 includes a first switching element 148, a second switching element 150, a light-emitting element 154, a transistor 152 for driving light-emitting elements (hereinafter referred to as drive transistor), a first capacitive element 156, and a second capacitive element 158.

The drive transistor 152 has a gate as a control terminal, and a source and drain as input-output terminals. In the pixel circuit shown in FIG. 6, the gate of the drive transistor 152 is connected to the second wiring 120 to which video signals are applied via the first switching element 148, the drain is connected to the sixth wiring 128 to which a power supply voltage (PVDD) is applied via the second switching element 150, and the source is connected to the light-emitting element 154. In the pixel circuit of FIG. 6, the drive transistor 152 is an n-channel type.

The first switching element 148 is controlled by an ON/OFF operation by a control signal SG (having VGH/VGL amplitude) applied to the first wiring 118a. When the first switching element 148 is on, potential based on the video signal Vsig applied to the second wiring 120 is applied to the gate of the drive transistor 152. The second switching element 150 is controlled by an ON/OFF operation by an operation signal BG (having VGH/VGL amplitude) of the first wiring 118b. When the second switching element 150 is on, the potential of the sixth wiring 128, to which a power supply voltage (PVDD) is applied, is applied to the drain of the drive transistor 152. The control signal VGH is a high-potential signal which turns on the first switching element 148 and the second switching element 150, and the control signal VGL is a low-potential signal which turns off the first switching element 148.

The first capacitive element 156 is provided between the source and gate of the drive transistor 152. The gate voltage of the drive transistor 152 is maintained by the first capacitive element 156. The second capacitive element 158 is connected on the source side of the drive transistor 152. The second capacitive element 158 is charged by the drain current of the drive transistor 152, and has a function for adjusting the light-emission current amount of the light-emitting element 154. In the pixel 110 having a circuit structure such as this, when voltage based on the video signal is applied to the gate of the drive transistor 152 and the second switching element 150 turns on, the current flows from the sixth wiring 128 to the light-emitting element 154 via the drive transistor 152. The light-emitting element 154 emits light in response to the electric current amount flowing when a voltage above the light-emitting threshold value is applied.

1-5. Structure of Pixel and Wiring Provided in Display Region

Figure 7:
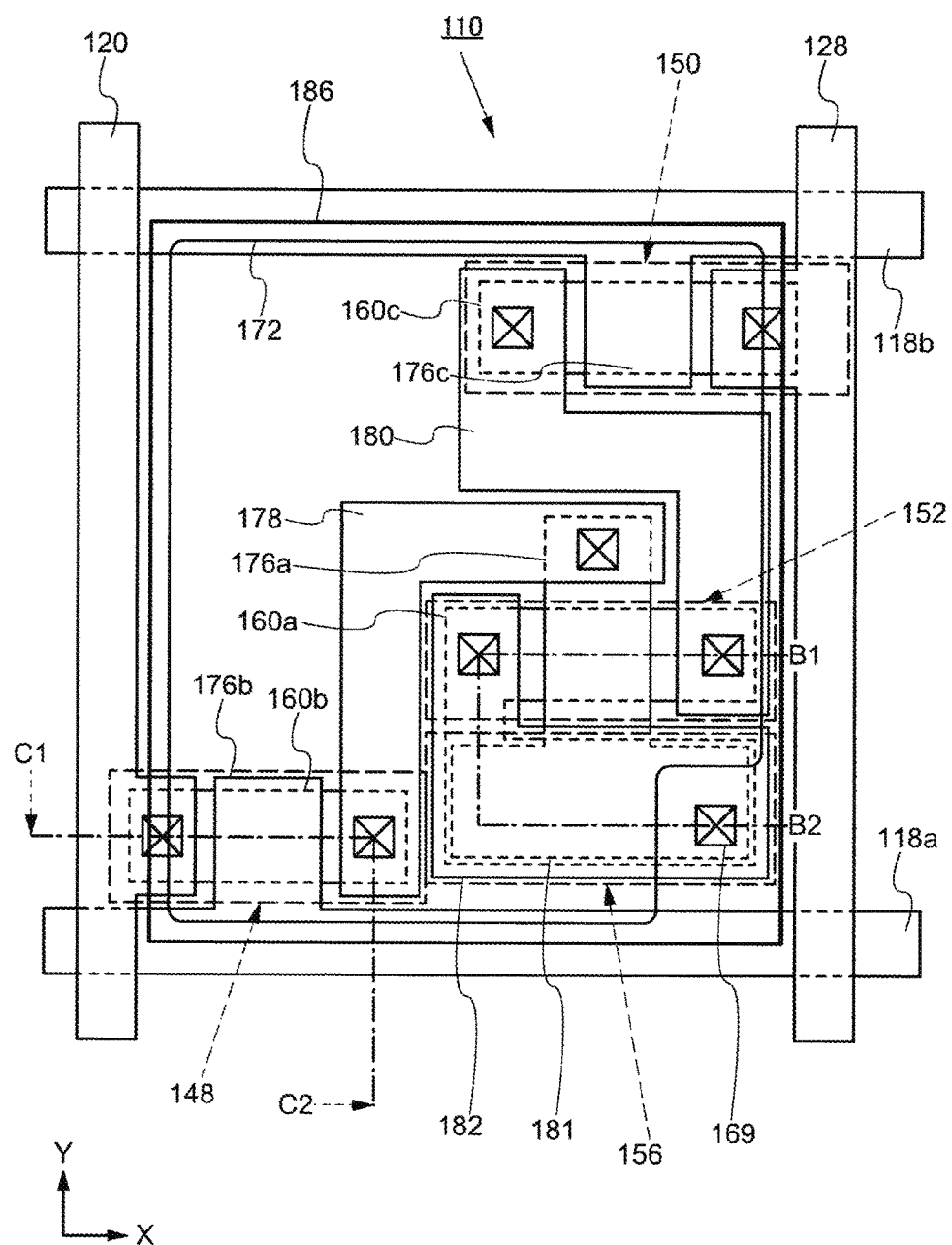
FIG. 7 is a diagram showing a planar structure of a pixel in a display device according to an embodiment of the present invention.

FIG. 7 is a plan view showing the structure of the pixel 110. The drive transistor 152, the first switching element 148, the second switching element 150, the first capacitive element 156, and the second capacitive element 158 are arranged in the pixel 110. The first wirings 118a, 118b, the second wiring 120, and the sixth wiring 128 are provided so as to surround these elements. The first wirings 118a, 118b are arranged in the X direction shown in FIG. 7, and the second wiring 120 and sixth wiring 128 are arranged in the Y direction. The first wirings 118a, 118b, the second wiring 120, and the sixth wiring 128 are arranged sandwiching an insulating layer and intersect. That is to say, the first wirings 118a, 118b, the second wiring 120, and the sixth wiring 128 are provided in different layers sandwiching the insulating layer.

One of the terminals of the input-output terminals (source and drain) of the first switching element 148 is electrically connected to the second wiring 120, and the other terminal is connected to a gate wiring 178. The control terminal (gate) of the first switching element 148 is connected to the first wiring 118a. One of the terminals of the input-output terminals of the second switching element 150 is connected to the sixth wiring 128, and the other terminal is connected to a drain wiring 180. The control terminal of the second switching element 150 is connected to the first wiring 118b. In the drive transistor 152, the drain region of a semiconductor layer 160a is connected to the drain wiring 180, the source region is connected to a source wiring 182, and a gate electrode 176a is connected to the gate wiring 178. A pixel electrode 186 is connected to the source wiring 182.

The first switching element 148 and the second switching element 150 are realized by a transistor. A semiconductor layer 160b and a gate electrode 176b are provided in the first switching element 148 via a gate insulating layer, and a semiconductor layer 160c and a gate electrode 176c are provided in the second switching element 150 via a gate insulating layer. The capacitive element 156 shown in FIG. 7 will be described below while referencing the cross-sectional structure of FIG. 8.

Figure 8:
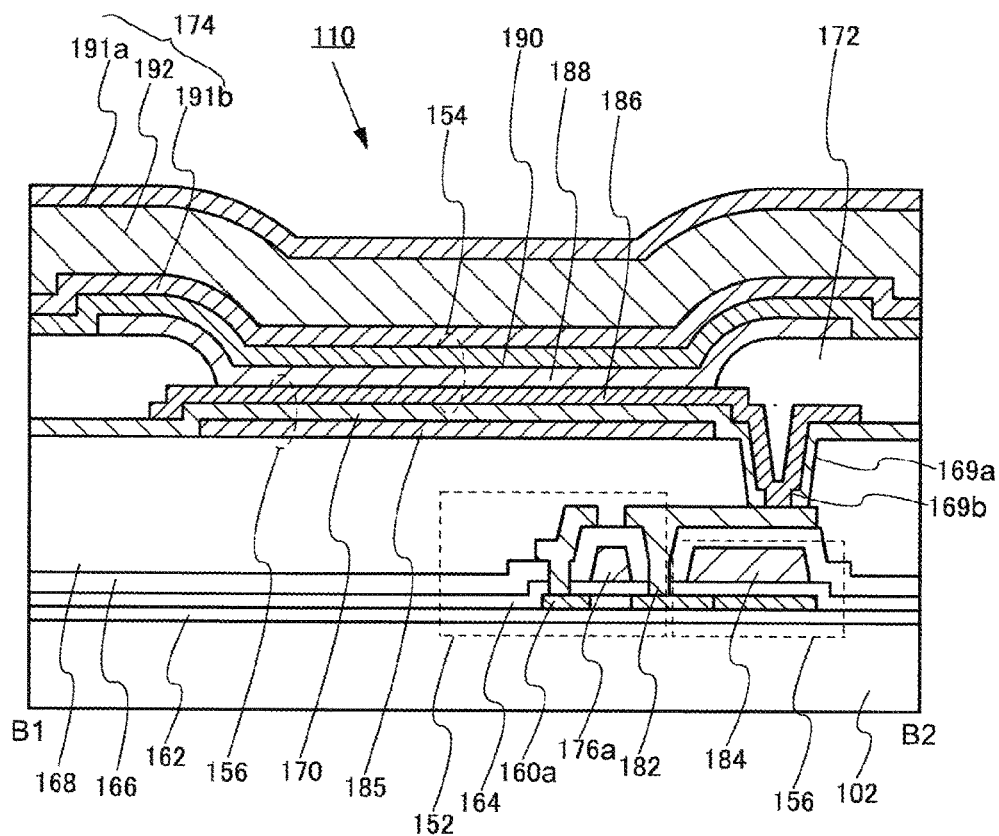
FIG. 8 is a diagram showing the structure of a pixel in a display device according to an embodiment of the present invention, and shows a cross-sectional structure corresponding to line B1-B2 shown in FIG. 7.
Figure 9:
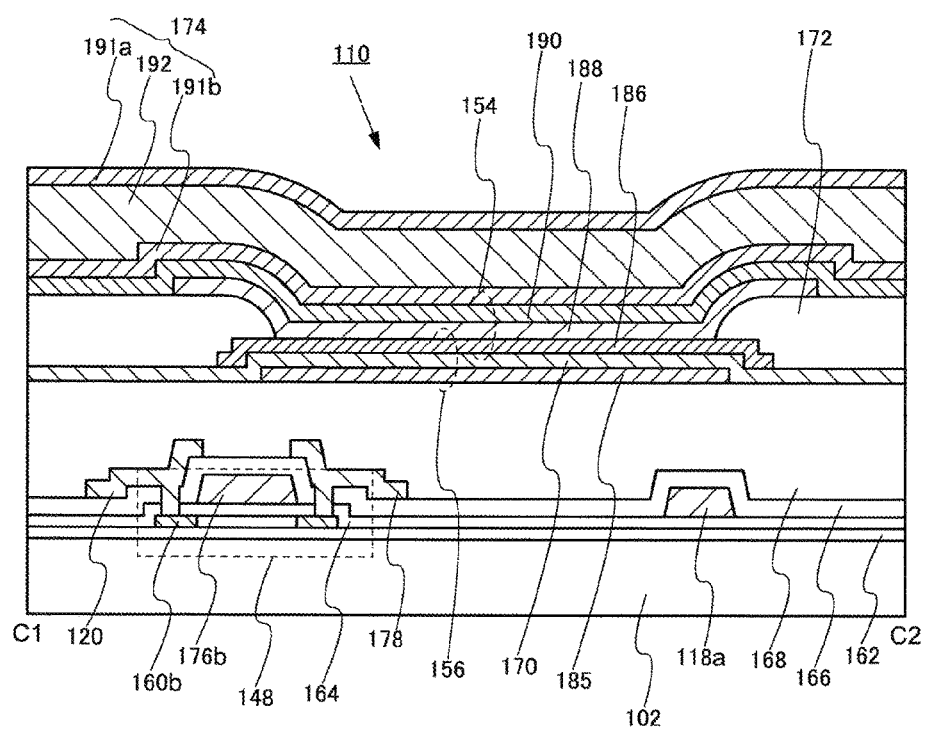
FIG. 9 is a diagram showing the structure of a pixel in a display device according to an embodiment of the present invention, and shows a cross-sectional structure corresponding to line C1-C2 shown in FIG. 7.

The cross-sectional structure taken along line B1-B2 shown in FIG. 7 is shown in FIG. 8, and the cross-sectional structure taken along line C1-C2 is shown in FIG. 9. Hereinafter, the structure of the pixel and wirings will be described while referencing FIG. 7, FIG. 8, and FIG. 9.

FIG. 8 shows the drive transistor 152, the light-emitting element 154, the first capacitive element 156, and the second capacitive element 158 included in the pixel 110. The cross-sectional structure of the pixel shown in FIG. 8 shows a structure in which the first insulating layer 162, the second insulating layer 164, the third insulating layer 166, the fourth insulating layer 168, the fifth insulating layer 170, a sixth insulating layer 172, and a seventh insulating layer 174 are stacked. Here, the first insulating layer 162 is a layer which may be called a base insulating layer. The second insulating layer 164 functions as a gate insulating layer, and the third insulating layer 166 and the fourth insulating layer 168 are layers which function as interlaying insulating layers.

The semiconductor layer 160a is provided between the first insulating layer 162 and the second insulating layer 164. A gate electrode 176a is provided above the second insulating layer 164. The drive transistor 152 has a structure in which the semiconductor layer 160a, the second insulating layer 164, and the gate electrode 176a are stacked. The third insulating layer 166 is provided above the gate electrode 176a. The source wiring 182 and the drain wiring 180 are provided above the third insulating layer 166. The source wiring 182 and the drain wiring 180 are connected to the semiconductor layer 160a by a contact hole provided in the third insulating layer 166. The fourth insulating layer 168 is provided above the source wiring 182 and the drain wiring 180. The fourth insulating layer 168 embeds the source wiring 182 and the drain wiring 180, and has a function as a planarization film having a flat surface.

The pixel electrode 186 is provided above the fourth insulating layer 168. The pixel electrode 186 is electrically connected to the source wiring 182 by contact holes 169a, 169b provided in the fourth insulating layer 168 and the fifth insulating layer 170. That is to say, the pixel electrode 186 is electrically connected to the drive transistor 152 via the source wiring 182.

In the first capacitive element 156, the first capacitive electrode 184 provided above the second insulating layer 164 is formed as a first electrode, and the source wiring 182 provided overlapping via the third insulating layer 166 is formed as a second electrode. The first capacitive electrode 184 is provided so as to sandwich the second insulating layer 164 and overlap the semiconductor layer 160a. The semiconductor layer 160a in a region overlapping with the first capacitor electrode 184 contains an impurity element imparting a first conductivity type and has a low resistance as same as the source region and the drain region, and it is possible to use as a third electrode of the first electrode of the first capacitive element 156. In the second capacitive element 158, the second capacitive electrode 185 provided above the fourth insulating layer 168 is formed as a fourth electrode, and the pixel electrode 186 arranged sandwiching the fifth insulating layer 170 is formed as a fifth electrode. The fifth insulating layer 170 is provided so as to cover the upper surface of the fourth insulating layer 168 and the upper surface of the second capacitive electrode 185. In this way, even if the surface area occupied by one pixel is not large, a plurality of elements may be integrated by using the source wiring 182 as the second electrode of the first capacitive element 156, and using the pixel electrode 186 as the fifth electrode of the second capacitive element 158.

The region in which the periphery of the pixel electrode 186 and the contact hole 169 in which the pixel electrode 186 is connected to the source wiring 182 are provided is covered by the sixth insulating layer 172. In other words, the sixth insulating layer 172 is provided above the fifth insulating layer 170, and an opening exposing the inner region of the pixel electrode 186 except the periphery is provided. The region in which the pixel electrode 186 is exposed by the sixth insulating layer 172 is defined, and this defined region becomes the light-emitting region of the pixel. A sixth insulting layer 172 such as this is called a partition or a bank.

The light-emitting element 154 has a structure in which the pixel electrode 186, an organic layer 188, and a common electrode 190 are stacked. In the light-emitting element 154, the region in which the pixel electrode 186, the organic layer 188, and the common electrode 190 overlap becomes the light-emitting region. The organic layer 188 and the common electrode 190 are provided from above the pixel electrode 186 to above the sixth insulating layer 172. The organic layer 188 is configured of one layer or a plurality of layers. The organic layer 188 includes at least organic electroluminescence material. The organic layer 188 corresponds to each pixel (that is to say, corresponds to a red pixel, a green pixel, and a blue pixel), and the structure of the organic layer 188 and the organic electroluminescence material included in the organic layer 188 may be different. For this reason, the organic layer 188 may be discreetly provided corresponding to each pixel, a portion of the layer may be shared among each pixel, and the light-emitting layer may be provided so as to differ in each pixel. The common electrode 190 is provided above the organic layer 188. The common electrode 190 is provided throughout a plurality of pixels. A seventh insulating layer 174 is provided as a passivation layer above the common electrode 190. The seventh insulating layer 174 has a structure in which a plurality of insulating film is stacked, and for example, is configured of an organic insulating layer 192*b* formed by an organic insulating film between a first inorganic insulating layer 191*a* and a second inorganic insulating layer 191*c* formed by inorganic insulating film.

In the present embodiment, the display device 100 has a so-called top emission type structure outputting light emitted in the light-emitting element 154 through the seventh insulating layer 174. Accordingly, the pixel electrode 186 functions as a light reflecting electrode, and the common electrode 190 has a function which allows light to pass through. For example, the pixel electrode 186 has a structure in which an indium tin oxide film (ITO) and a metallic film such as aluminum applied as anode material are stacked. On the other hand, the common electrode 190 is formed by a magnesium-silver alloy or a lithium-aluminum alloy thin film applied as a cathode.

FIG. 9 shows a cross-sectional structure of the first switching element 148 and the light-emitting element 154. The first switching element 148 has a structure in which the semiconductor layer 160*b*, the second insulating layer 164, and the gate electrode 176*b* are stacked above the first insulating layer 162. One of the input-output terminals of the first switching element 148 (a source region or a drain region) is electrically connected to the second wiring 120, and the other terminal (drain region or source region) is connected to the gate wiring 178.

Here, the first insulating layer 162, the second insulating layer 164, and the fifth insulating layer 170 are layers formed by an inorganic insulating material, and for example, are formed by an inorganic insulating film such as a silicon oxide film, a silicon nitride film, or a silicon oxynitride film. The first insulating layer 162, the second insulating layer 164, and the fifth insulating layer 170 may be formed in a single inorganic insulating layer or, for example, may be formed in a stacked layer structure of a silicon oxide film and a silicon nitride film. The fourth insulating layer 168 and the sixth insulating layer 172 may be formed by an inorganic insulating film, however, these layers are preferably formed by organic resin material such as an acrylic resin or a polyimide resin. The seventh insulating layer 174 has a structure having a single layer of a silicon nitride film, a stacked layer of a silicon nitride film and a silicon oxide film, or a silicon nitride film provided above and below an organic insulating film. The semiconductor layer 160*a* is formed of polycrystalline silicon, hydrogenated amorphous silicon, and an oxide semiconductor. Here, the oxide semiconductor is a metallic oxide having semiconductor properties, and is a chemical compound including at least one type or more of an oxide of a metallic element selected from indium, gallium, zinc, or tin. The second insulating layer 164 is a layer functioning as a gate insulating layer, and is formed of a silicon oxide film, a silicon nitride film, or the like. The gate electrode 176*a* is formed of a metallic film such as aluminum, titanium, molybdenum, or tungsten. For example, the gate electrode 176*a* has a structure in which titanium and aluminum are stacked. The drain wiring 180 and the source wiring 182 are formed by a second conductive layer. The second conductive layer is formed of a metallic film such as titanium, molybdenum, or aluminum, for example, having a structure in which an aluminum film is sandwiched by a titanium film above and below.

1-6. Structure of Wiring in Bending Region

Figure 10A:
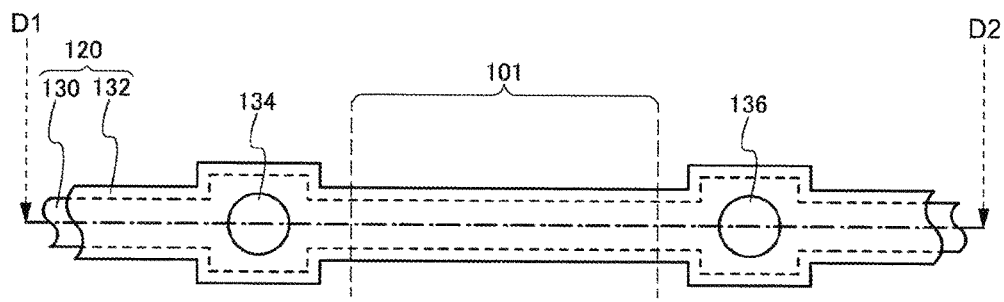
FIG. 10A is a plan view showing the structure of a wiring according to an embodiment of the present invention.
Figure 10B:
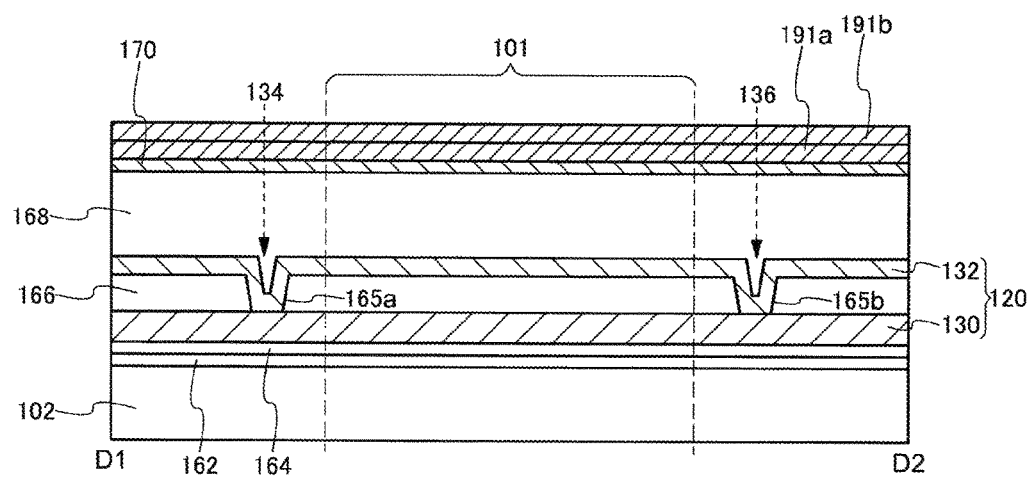
FIG. 10B is a diagram showing the structure of a wiring according to an embodiment of the present invention, and shows a cross-sectional view corresponding to line D1-D2 shown in FIG. 10A.

In the display device 100 having a pixel structure shown in FIG. 7, FIG. 8, and FIG. 9, the structure of a wiring provided in the region corresponding to the bending region 101 is shown in FIG. 10A and FIG. 10B. FIG. 10A and FIG. 10B show an example of the second wiring 120 as an example of the wiring intersecting the bending region 101. FIG. 10A shows a plan view of the second wiring 120, and FIG. 10B shows a cross-sectional structure taken along line D1-D2.

The second wiring 120 is configured by the first conductive layer 130 provided above the second insulating layer 164, and the second conductive layer 132 provided above the third insulating layer 166. The third insulating layer 166 is provided between the first conductive layer 130 and the second conductive layer 132. The first conductive layer 130 and the second conductive layer 132 are electrically connected in the first connection portion 134 and the second connection portion 136 provided in the third insulating layer. The first connection portion 134 and the second connection portion 136 include contact holes 165*a*, 165*b* formed in the third insulating layer 166. The first connection portion 134 and the second connection portion 136 are arranged on the outer sides of the bending region 101 as described in FIG. 1.

In the second wiring 120, the first conductive layer 130 is formed by the same conductive layer as the first wiring 118. The second conductive layer 132 is formed by the same conductive layer as the second wiring 120. That is, the first conductive layer 130 is formed by the same conductive layer as the gate electrode 176, the source wiring 182, and the drain wiring 180. In the bending region 101, the first conductive layer 130 and the second conductive layer 132 are separated by the third insulating layer 166. The first wiring 118 in the display region 104 is not arranged in the bending region 101, so the first conductive layer 130 and the second conductive layer 132 may be arranged substantially parallel, sandwiching the third insulating layer 166, and overlapping.

In this way, according to the display device according to the present embodiment, the first conductive layer 130 and the second conductive layer 132 may be formed by a conductive layer in the same layer as the wiring formed in the display region 104. In this way, in the wiring in the bending region 101, a structure providing redundancy against bending may be manufactured without adding a new step or a new layer.

According to the present embodiment, even when a portion of the display device is bent, wiring disconnection may be prevented. That is to say, in a display device that may be bent or folded, display defects due to wiring disconnection may be prevented.

Second Embodiment 2-1. Configuration of Display Device

Figure 11:
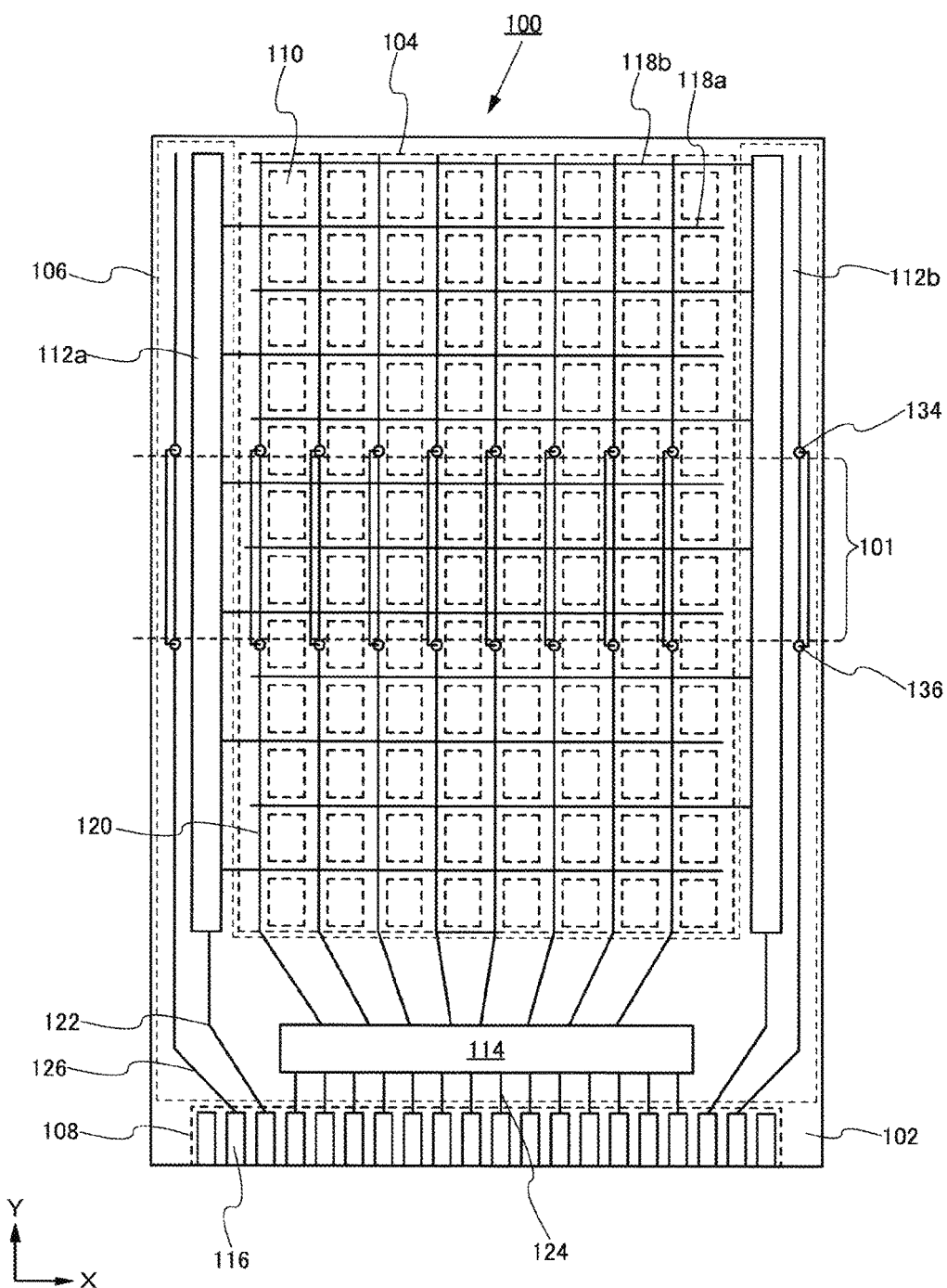
FIG. 11 is a diagram showing the structure of a display device according to an embodiment of the present invention.

FIG. 11 shows an embodiment of the display device 100 in which the bending region 101 overlaps the display region 104. The second wiring 120 and the fifth wiring 126 arranged in a direction intersecting the bending region 101 are configured by a plurality of conductive layers in at least the bending region 101 similar to the first embodiment, and have a connection portion in which conductive layers provided in different layers in the outer region of the bending region 101 are electrically connected. In this way, the same signals are applied to the plurality of conductive layers configuring the second wiring 120, and disconnection defects of the second wiring 120 are prevented. The display device 100 shown in FIG. 11 is as same as the display device shown in the first embodiment, except for the different position of the bending region 101.

2-2. Configuration of Display Region

Figure 12:
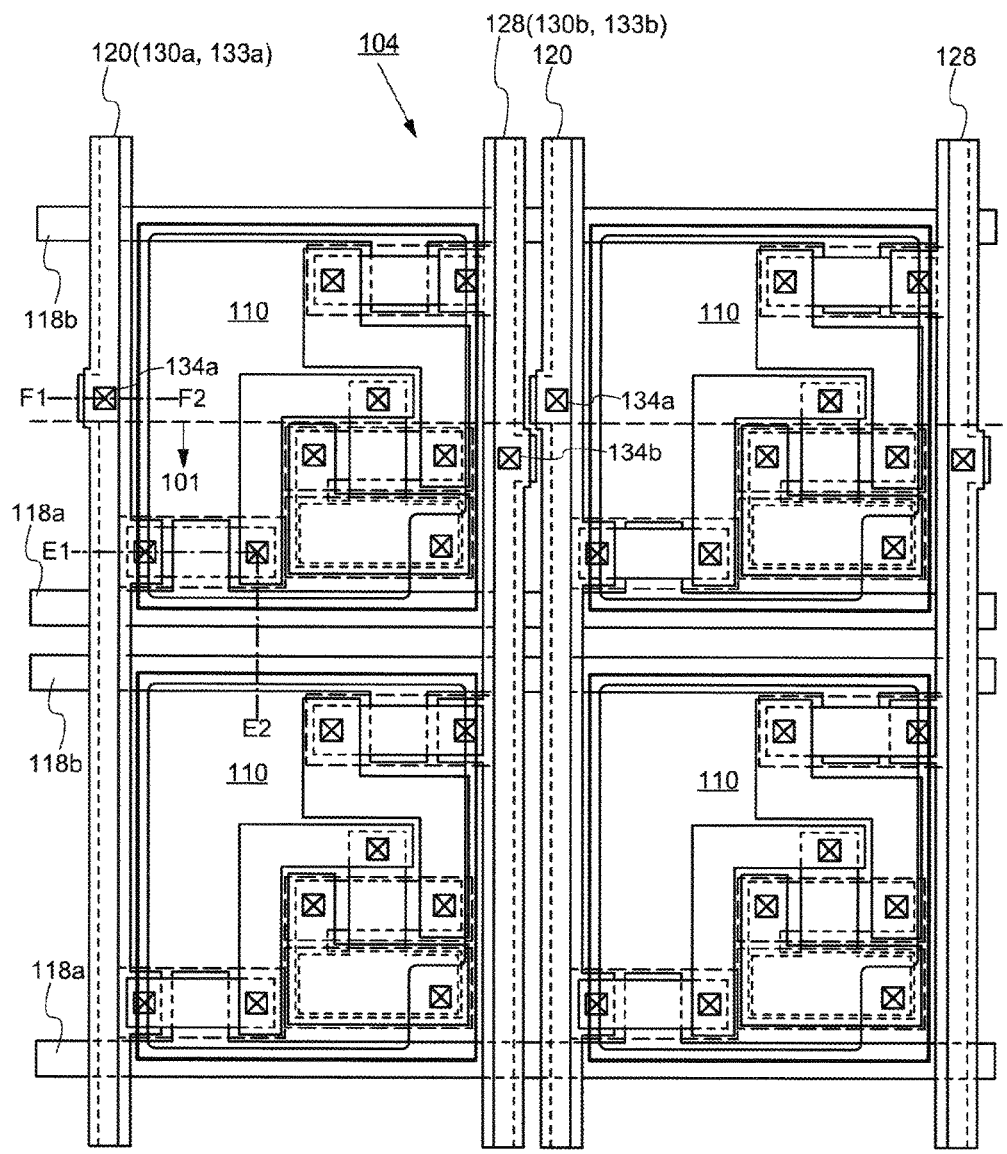
FIG. 12 is a diagram showing a planar structure of a pixel and a wiring arranged in a display region in a display device according to an embodiment of the present invention.

The details of the wiring structure of the display device 100 according to the present embodiment will be described while referencing the drawings. FIG. 12 exemplifies a state in which four pixels 110 are arranged in the display region 104. The configuration of the pixel 110 is the same as that described in first embodiment. The first wiring 118 is arranged in the X direction shown in the drawings, and the second wiring 120 and the sixth wiring 128 are arranged in the Y direction in the display region 104.

In these wirings, the second wiring 120 and the sixth wiring 128 extending in the Y direction have a multilayer structure. That is, the second wiring 120 is configured by a first conductive layer 130a and a second conductive layer 132a. The first conductive layer 130a and the second conductive layer 132a extend in the same direction (Y direction) but are electrically connected in the first connection portion 134a. The first connection portion 134a is arranged in the region outside the bending region 101. The sixth wiring 128 arranged substantially parallel to the second wiring 120 is similarly configured by a first conductive layer 130b and a second conductive layer 132b, and is electrically connected in the first connection portion 134b.

Figure 13:
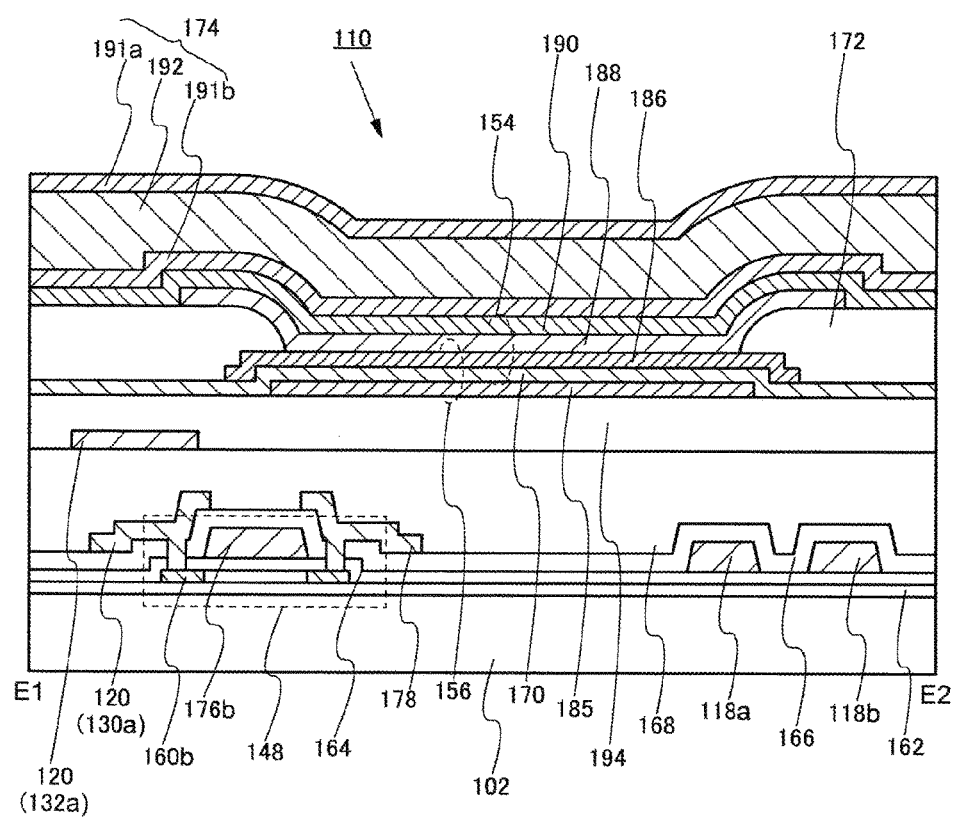
FIG. 13 is a diagram showing the structure of a pixel in a display device according to an embodiment of the present invention, and shows a cross-sectional structure corresponding to line E1-E2 shown in FIG. 12.
Figure 14:
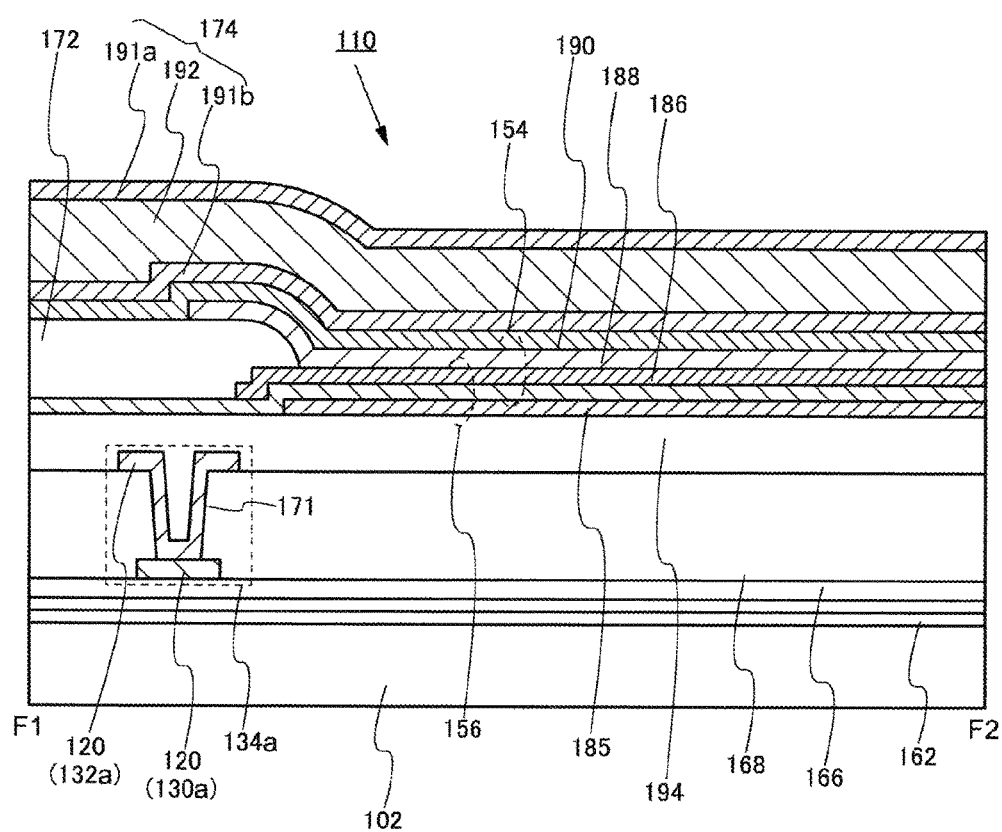
FIG. 14 is a diagram showing the structure of a pixel in a display device according to an embodiment of the present invention, and shows a cross-sectional structure corresponding to line F1-F2 shown in FIG. 12.

FIG. 13 and FIG. 14 are cross-sectional views showing the structure of the second wiring 120. FIG. 13 shows a cross-sectional structure taken along line E1-E2 shown in FIG. 12, and FIG. 14 shows a cross-sectional structure taken along line F1-F2.

As is shown in FIG. 13 and FIG. 14, the first conductive layer 130a is provided above the third insulating layer 166. The first conductive layer 130a is electrically connected to the source region or the drain region of the first switching element 148 by a contact hole penetrating the second insulating layer 164 and the third insulating layer 166. The first conductive layer 130a is formed by the same conductive layer as the source wiring 182 and the drain wiring 180. The fourth insulating layer 168 is provided above the third insulating layer 166. The second conductive layer 132a is provided above the fourth insulating layer 168. The first conductive layer 130a and the second conductive layer 132a are separated by the fourth insulating layer 168. An eighth insulating layer 194 is provided between the fourth insulating layer 168 and the fifth insulating layer 170. The eighth insulating layer 194 embeds the second conductive layer 132a. The pixel electrode 186 and the second capacitive electrode 185 are provided above the eighth insulating layer 194. In the present embodiment, the fifth insulating layer 170 is provided above the second conductive layer 132a, so if the second conductive layer 132a is arranged in a position not interfering with the pixel electrode 186 and the second capacitive electrode 185, the eighth insulating layer 194 may be omitted.

FIG. 14 shows the configuration of the first connection portion 134a in which the first conductive layer 130a and the second conductive layer 132a are connected. A contact hole 171 penetrating the fourth insulating layer 168 is provided in the first connection portion 134a. The first conductive layer 130a and the second conductive layer 132a forming the second wiring 120 are electrically connected via the contact hole 171. The contact hole 171 is embedded by the eighth insulating layer 194 formed by an organic resin material such as a polyimide resin, or an acrylic resin. For this reason, even if the contact hole 171 is formed in an arbitrary location of the fourth insulating layer 168, the flatness of the underlying surface of the pixel electrode 186 may be maintained. Even when the eighth insulating layer 194 is omitted, the contact hole 171 is arranged in a region of the sixth insulating layer 172 called a partition layer or a bank layer so as not to interfere with the flatness of the underlying surface of the region in which the pixel electrode 186 is formed.

The first conductive layer 130a and the second conductive layer 132a are preferably arranged so as to sandwich the fourth insulating layer 168 and overlap. By arranging the first conductive layer 130 and the second conductive layer 132 to overlap, the spaces between the pixels may be narrowed, and high-definition pixels may be achieved. On the other hand, as is shown in FIG. 12, the first conductive layer 130 and the second conductive layer 132 may be arranged in parallel with the fourth insulating layer 168 interposed therebetween and may be arranged so-as to be shifted in the X direction in a plan view. The width of one or both of the first conductive layer 130 and the second conductive layer 132 may be widened in the first connection portion 134 and the second connection portion 136. In this way, by providing redundancy to the arrangement and width of the first conductive layer 130 and the second conductive layer 132, an alignment margin may be given in the wiring formation process.

The first connection portion 134a provided in the second wiring 120 is preferably provided in each row of the second wiring 120. A structure of wiring and connection portions such as this are similarly applied to the sixth wiring 128. The first connection portion 134b is provided in the sixth wiring 128. FIG. 12 shows an embodiment in which the first connection portion 134a is provided adjacent to the pixel 110, however, the second connection portion 136 is provided corresponding to this. That is to say, the purpose of providing the first connection portion 134 and the second connection portion 136 sandwiching the bending region 101 is the same as that of the first embodiment.

According to the present embodiment, the wiring extending in a first direction in the display region 104 is multilayered, and by providing a connection portion connecting the multilayer wirings to each other in the outer region of the bending region, wiring disconnection may be prevented even when the display region 104 is bent. In this way, reliability of a display device having flexibility may be increased.

Third Embodiment 3-1. Configuration of Display Device

Figure 15:
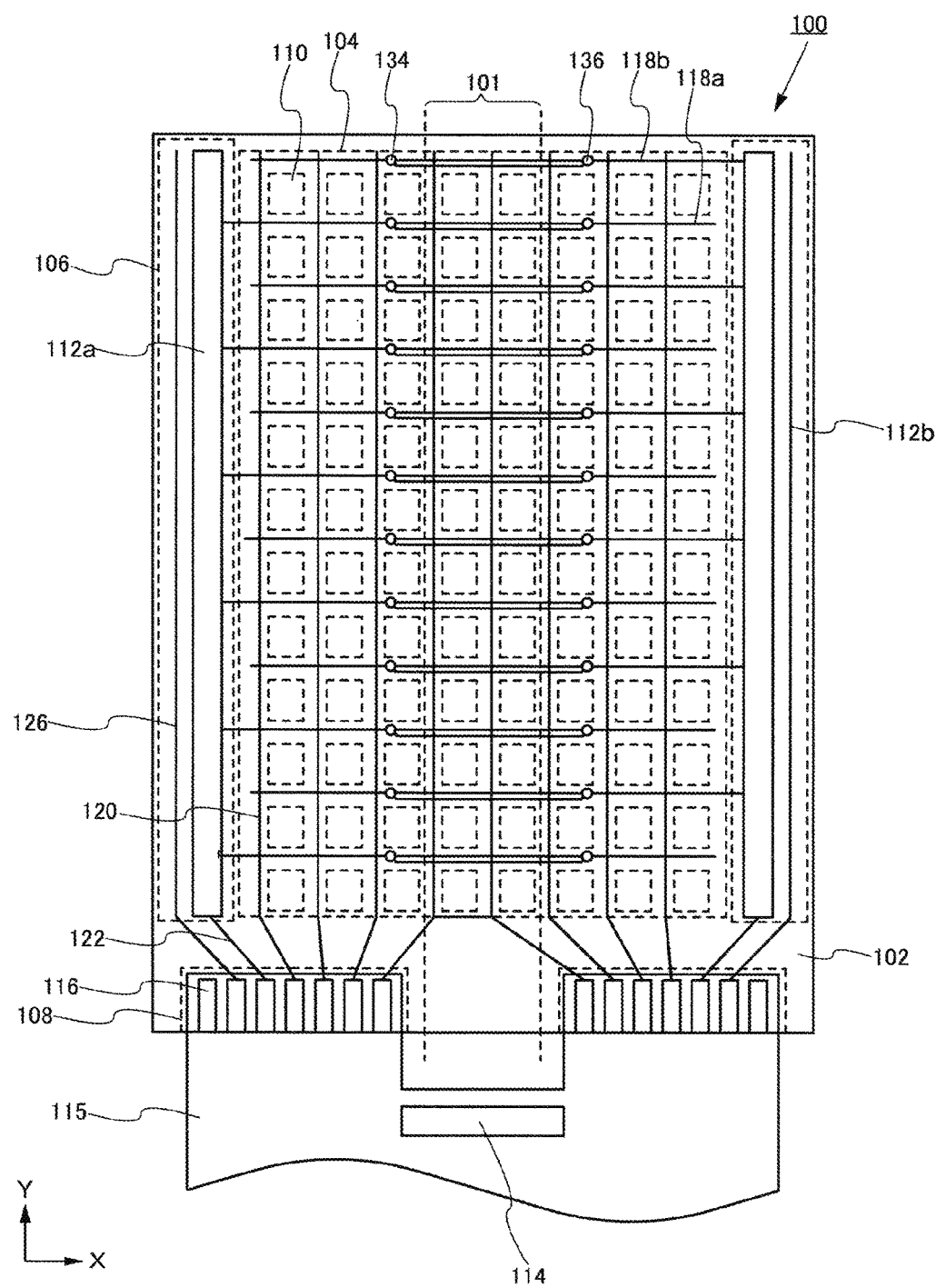
FIG. 15 is a diagram showing a structure of a display device according to an embodiment of the present invention.

FIG. 15 shows an embodiment of the display device 100 in which the bending region 101 overlaps the display region 104. The first wirings 118a, 118b arranged in a direction intersecting the bending region 101 have a structure in which a first conductive layer and a second conductive layer are provided sandwiching an insulating layer in at least the bending region, similar to that of the first embodiment. The wirings 118a, 118b electrically connected by the first connection portion 134 and the second connection portion 136 in the outer region of the bending region 101 of the first conductive layer and the second conductive layer have a wiring structure such as this in at least the region intersecting the bending region 101.

As is shown in FIG. 15, the terminal region 108 may be arranged so as not to overlap the bending region 101. The second drive circuit 114 may be arranged on a flexible print wiring substrate 115 instead of above a substrate 102 so as not to overlap the bending region 101. Further, the display device 100 shown in FIG. 15 is the same as the display device shown in the first embodiment, except for the position of the bending region 101.

3-2. Configuration of Display Region

Figure 16:
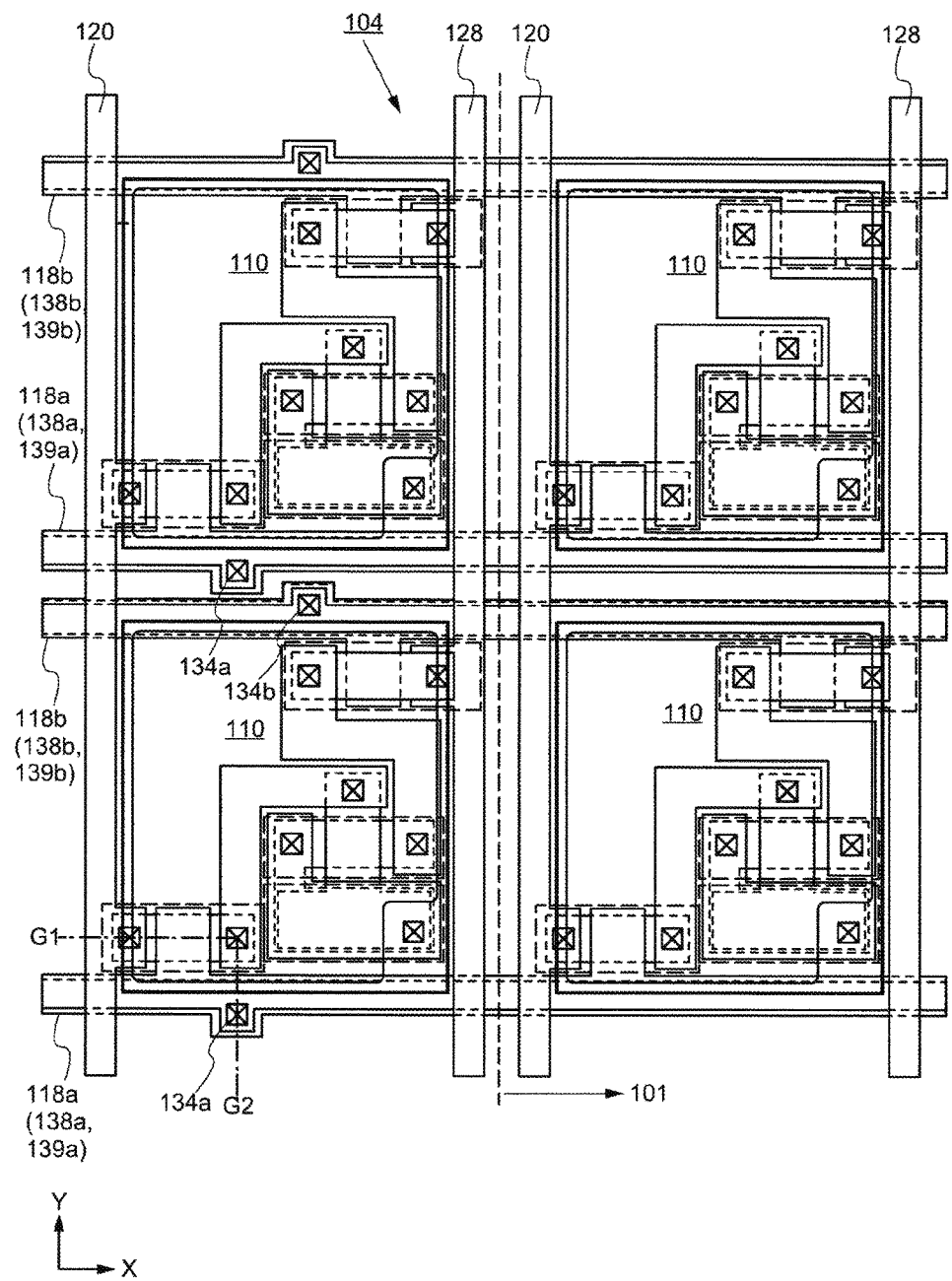
FIG. 16 is a diagram showing a planar structure of a pixel and a wiring arranged in a display region in a display device according to an embodiment of the present invention.
Figure 17:
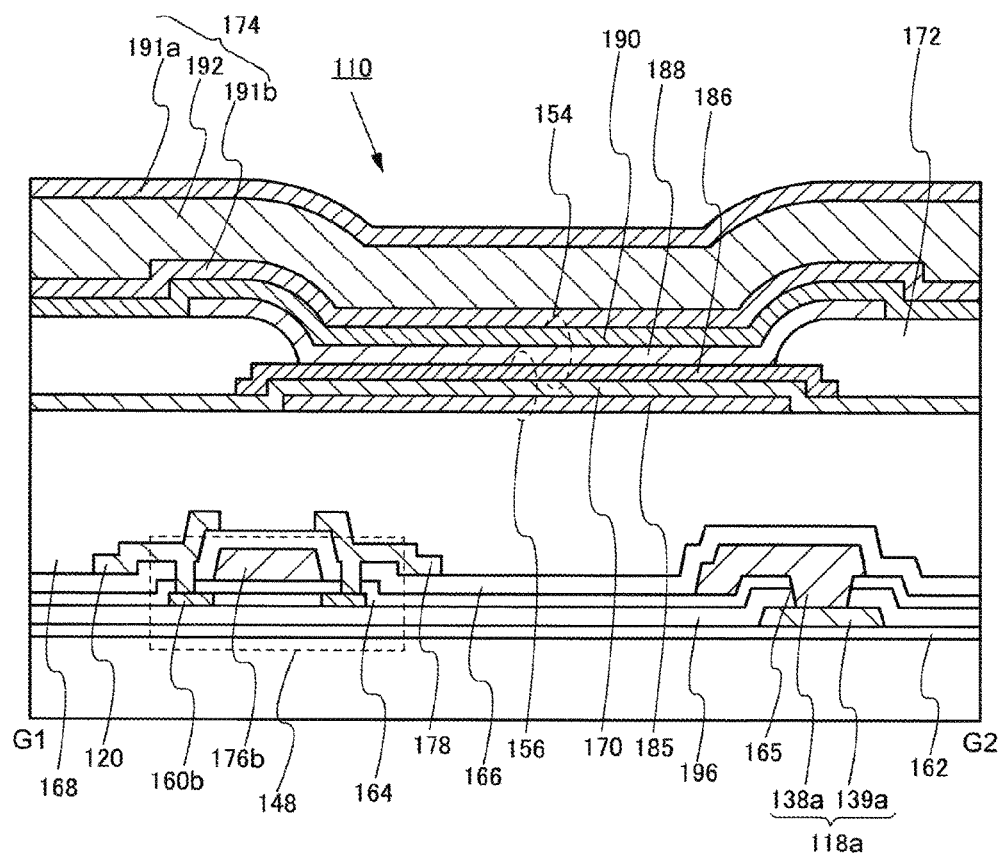
FIG. 17 is a diagram showing the structure of a pixel in a display device according to an embodiment of the present invention, and shows a cross-sectional structure corresponding to line G1-G2 shown in FIG. 16.

FIG. 16 shows an example in which the first connection portion 134a is provided in the first wiring 118a, and the first connection portion 134b is provided in the first wiring 118b. The bending region 101 is located along the Y direction shown in FIG. 16. The first connection portions 134a, 134b are provided on the outer sides of the bending region 101. Thus, the same signal is applied to the plurality of conductive layers configuring the first wiring 118, and disconnection defects of the first wiring 118 are prevented. The configuration of the pixel 110 is the same as that of the first embodiment. FIG. 17 shows a cross-sectional structure taken at line G1-G2.

As is shown in FIG. 16 and FIG. 17, the first wiring 118a is configured by the first conductive layer 138a and the second conductive layer 139a. The first conductive layer 138a is provided above the first insulating layer 162. A ninth insulating layer 196 is provided, and the second insulating layer 169 is further stacked above the first conductive layer 138a. The semiconductor layer 160b is provided between the ninth insulating layer 196 and the second insulating layer 164. The second conductive layer 139a is provided above the second insulating layer 164. The second conductive layer 139 is arranged so as to overlap the first conductive layer 138a via the ninth insulating layer 196 and the second insulating layer 164. A contact hole (through-hole) 165 is formed in the second insulating layer 164 and the ninth insulating layer 196 in the first connection portion 134a. The first conductive layer 138a and the second conductive layer 139a are electrically connected via the contact hole 165.

The second conductive layer 139a is formed by a conductive film in the same layer as the gate electrode 176 in the first wiring 118a. The first conductive layer 138a is provided further below than the semiconductor layer 160, and is covered by the ninth insulating layer 196. Therefore, even if the first conductive layer 138a is formed, negative effects such as metallic contamination may be prevented in the manufacturing process of the semiconductor layer 160. The first connection portion 134a is arranged in the region of the outer side of the pixel electrode 186, and is embedded by the fourth insulating layer 168. Thus, the first connection portion 134a may be arranged so as not to affect the light-emitting element 154. A configuration such as this may be the same for the first wiring 118b.

Figure 18:
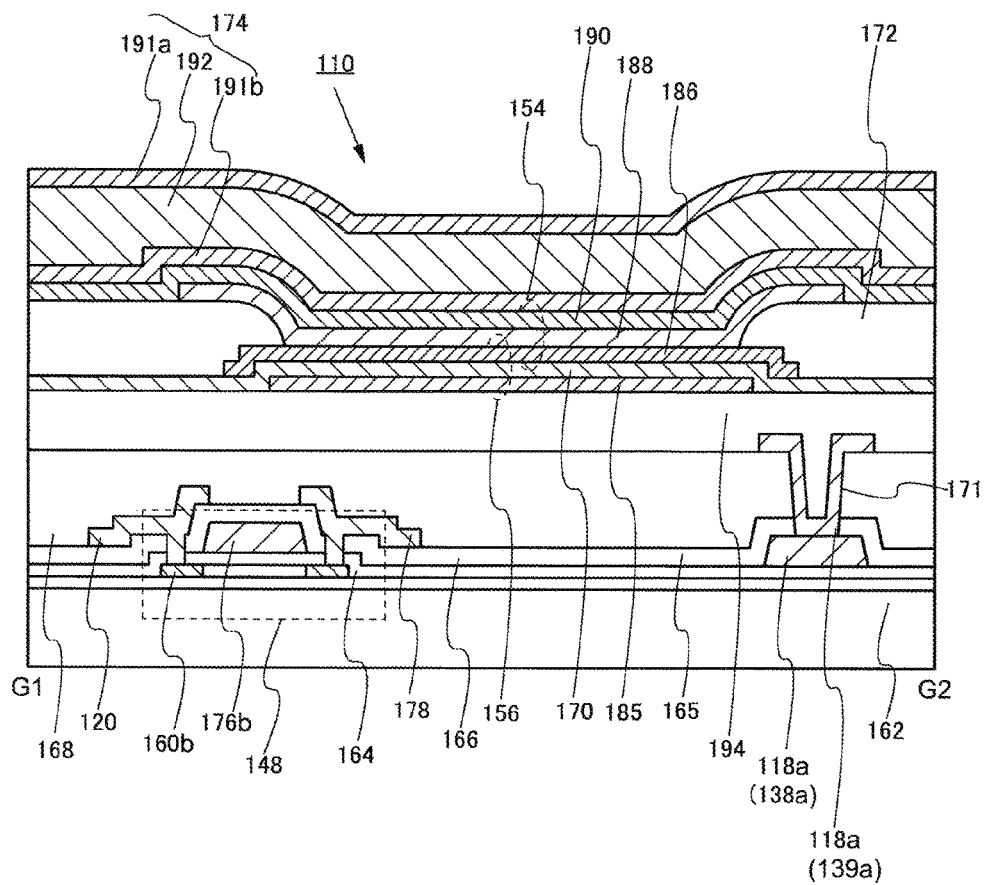
FIG. 18 is a cross-sectional view showing the structure of a pixel in a display device according to an embodiment of the present invention.

As is shown in FIG. 18, similar to the second embodiment, the eighth insulating layer 194 may be provided, and the first wiring 118a and the second conductive layer 139a may be provided above the eighth insulating layer 194. The first conductive layer 138 and the second conductive layer 139 are electrically connected by the contact hole 171 provided in the fourth insulating layer 168 configuring the first connection portion 134.

In this way, according to the present embodiment, by providing the first connection portion 134 and the second connection portion 136 in the first wiring 118, the bending portion 101 along the Y direction may be included in the display device 100. The first wiring 118 is multilayered in at least the region including the bending region 101. By providing the first connection portion 134 and the second connection portion 136 connecting the multilayer wirings to each other in the outer region of the bending region 101, wiring disconnection may be prevented even when the display region 104 is bent. Thus, reliability of a display device having flexibility may be improved.

What is claimed is:

1. A display device, comprising:
   a substrate;
   a display region including a plurality of pixels on a plane of the substrate;
   wherein
   the display region includes
      a first insulating layer and a second insulating layer above the substrate;
      a first wiring above the second insulating layer running in a first direction;
      a third insulating layer above the second insulating layer;
      a second wiring running in a second direction intersecting the first wiring; and
      a transistor including a semiconductor layer between the first insulating layer and the second insulating layer, and a gate electrode between the second insulating layer and the third insulating layer,
   the second wiring includes a first conductive layer above the second insulating layer; and a second conductive layer above the third insulating layer,
   the first conductive layer and the second conductive layer are electrically connected at a first connection portion and a second connection portion separated from the first connection portion,
   the first connection portion is in a first contact hole penetrating the third insulating layer,
   the second connection portion is in a second contact hole penetrating the third insulating layer,
   the first insulating layer is between the substrate and the second insulating layer,
   a source region and a drain region of the transistor are connected to a source wiring and a drain wiring respectively, the source wiring and the drain wiring located above the third insulating layer,
   the first conductive layer, the source wiring, and the drain wiring are in a same layer, and
   the second conductive layer is located above the first conductive layer.

2. The display device according to claim 1, wherein the substrate has flexibility and includes a bending region, and
   the bending region is between the first connection portion and the second connection portion.

3. The display device according to claim 2, wherein a support member is provided on a rear surface of the substrate, the rear surface being an opposite side of the second insulating layer,
   the support member has a notch portion between the first connection portion and the second connection portion, and
   the notch is arranged corresponding to the bending region.

4. The display device according to claim 1, wherein a same signal is applied to the first conductive layer and the second conductive layer.

* * * * *